United States Patent
Sharma et al.

(10) Patent No.: US 10,871,720 B2
(45) Date of Patent: Dec. 22, 2020

(54) APPARATUS FOR SUPPORTING A SEMICONDUCTOR WAFER AND METHOD OF VIBRATING A SEMICONDUCTOR WAFER

(71) Applicant: TAIWAN SEMICONDUCTOR MANUFACTURING CO., LTD., Hsinchu (TW)

(72) Inventors: Astha Sharma, Meerut Cantt (IN); Chia-Hung Lai, Keelung (TW); Hsin-Kuo Chang, Hsinchu (TW); Jaw-Lih Shih, Jhudong Township (TW); Hong-Hsing Chou, Jhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 648 days.

(21) Appl. No.: 14/505,320

(22) Filed: Oct. 2, 2014

(65) Prior Publication Data

US 2016/0096155 A1 Apr. 7, 2016

(51) Int. Cl.
*H01L 21/67* (2006.01)
*H01L 21/687* (2006.01)
*B60B 1/06* (2006.01)
*H01L 21/306* (2006.01)
*H01L 21/461* (2006.01)
(Continued)

(52) U.S. Cl.
CPC ............ *G03F 7/70858* (2013.01); *B06B 1/06* (2013.01); *H01L 21/30625* (2013.01);
(Continued)

(58) Field of Classification Search
CPC .............. G03F 7/709; H01L 21/68792; H01L 21/6715; H01L 21/306; H01L 21/302;
(Continued)

(56) References Cited

U.S. PATENT DOCUMENTS 4,239,790 A * 12/1980 Bosenberg .............. G03F 7/201
  250/492.2
4,633,804 A *  1/1987 Arii ..................... H01L 21/6715
  118/501

(Continued)

FOREIGN PATENT DOCUMENTS

EP       0 769 725 A2    4/1997

*Primary Examiner* — Katherine Zalasky McDonald
(74) *Attorney, Agent, or Firm* — Maschoff Brennan

(57) ABSTRACT

In embodiments of the present disclosure, a vibrator is used to generate a vibration wave with a variable frequency that can agitate and facilitate the circulation of the processing fluids, thereby enhancing the uniformity and efficiency of the resulting semiconductor device features, the vibrator may be a piezoelectric vibrator or other similar vibrators. In some embodiments, the vibration of the processing fluids can facilitate the processing fluids in circulating in and out of narrow channels or features, or the vibration of the processing fluids can facilitate the bubbling out of the microbubbles entrapped in the processing liquid or entrapped between the surface of the semiconductor wafer and the processing liquid. In another embodiment, the vibrations generated by the vibrator have vibration waves with a variable frequency to avoid resonance that may damage the semiconductor wafer and the features thereon.

20 Claims, 8 Drawing Sheets

(51) Int. Cl.
*B24B 1/04* (2006.01)
*H01L 41/09* (2006.01)
*G03F 7/20* (2006.01)
*B06B 1/06* (2006.01)

(52) U.S. Cl.
CPC ........ *H01L 21/461* (2013.01); *H01L 21/6715* (2013.01); *H01L 21/68792* (2013.01); *B24B 1/04* (2013.01); *H01L 41/09* (2013.01)

(58) Field of Classification Search
CPC ............. H01L 21/304; H01L 21/30625; H01L 21/461; H01L 21/463; H01L 41/09; B01F 11/0014; B01F 11/0094; B28B 1/0873; B06B 1/10; B06B 1/06; B24B 7/00; B24B 1/04
USPC ................... 366/111, 114; 451/165, 287, 288
See application file for complete search history.

(56) References Cited

U.S. PATENT DOCUMENTS

| | | | | |
|---|---|---|---|---|
| 4,655,162 A * | 4/1987 | Kameyama | ......... | H01L 21/6838 118/416 |
| 5,187,899 A * | 2/1993 | Rhoades | ................... | B24B 1/04 451/165 |
| 5,366,757 A * | 11/1994 | Lin | ................... | G03F 7/162 118/52 |
| 5,688,364 A * | 11/1997 | Sato | ................... | B24B 1/04 156/345.12 |
| 5,798,140 A * | 8/1998 | Parodi | ................... | B05D 1/002 118/52 |
| 5,849,435 A * | 12/1998 | Akram | ................... | G03F 7/162 430/3 |
| 6,010,255 A | 1/2000 | Chiu | | |
| 6,270,397 B1 * | 8/2001 | Wu | ................... | B24B 37/005 451/165 |
| 6,435,956 B1 * | 8/2002 | Ohwada | ................... | B24B 37/30 257/E21.23 |
| 6,482,743 B1 * | 11/2002 | Sato | ................... | H01L 21/3212 257/E21.304 |
| 6,533,865 B1 | 3/2003 | Phan et al. | | |
| 2005/0145482 A1 * | 7/2005 | Suzuki | ................... | C25D 17/001 204/199 |
| 2007/0287361 A1 * | 12/2007 | Bottema | ................... | B24B 53/017 451/11 |
| 2013/0082727 A1 * | 4/2013 | Matsumura | ................... | G01R 31/2893 324/750.16 |
| 2014/0273509 A1 * | 9/2014 | Wang | ................... | H01L 21/6715 438/760 |

* cited by examiner

APPARATUS FOR SUPPORTING A SEMICONDUCTOR WAFER AND METHOD OF VIBRATING A SEMICONDUCTOR WAFER

BACKGROUND

Various semiconductor manufacturing processes involves the use of process liquids such as photoresist and developer in lithography process, and water in rinsing or washing process. In the manufacturing, microbubbles are introduced at the interface between a semiconductor wafer and the process liquid when dispensing the process liquid onto the wafer, these microbubbles may cause defect in the features in the resulting semiconductor device.

In the lithography process, the developing speed is limited by solution diffusibility and the developer becomes stagnant with the photoresist and fresh developer cannot diffuse toward the photoresist, this results in non-uniform photoresist and non-uniform features in the semiconductor device. Mechanically rotating the wafer while spraying the developer on the photoresist is a way to achieve uniform resist development. However, as technology nodes shrink, more emphasis is placed on the uniformity of the features in the semiconductor device such that the mechanical rotation becomes insufficient in resist development, much less the defects resulting from the microbubbles. Therefore, the defect in the semiconductor device needs to be addressed to obtain the desired device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
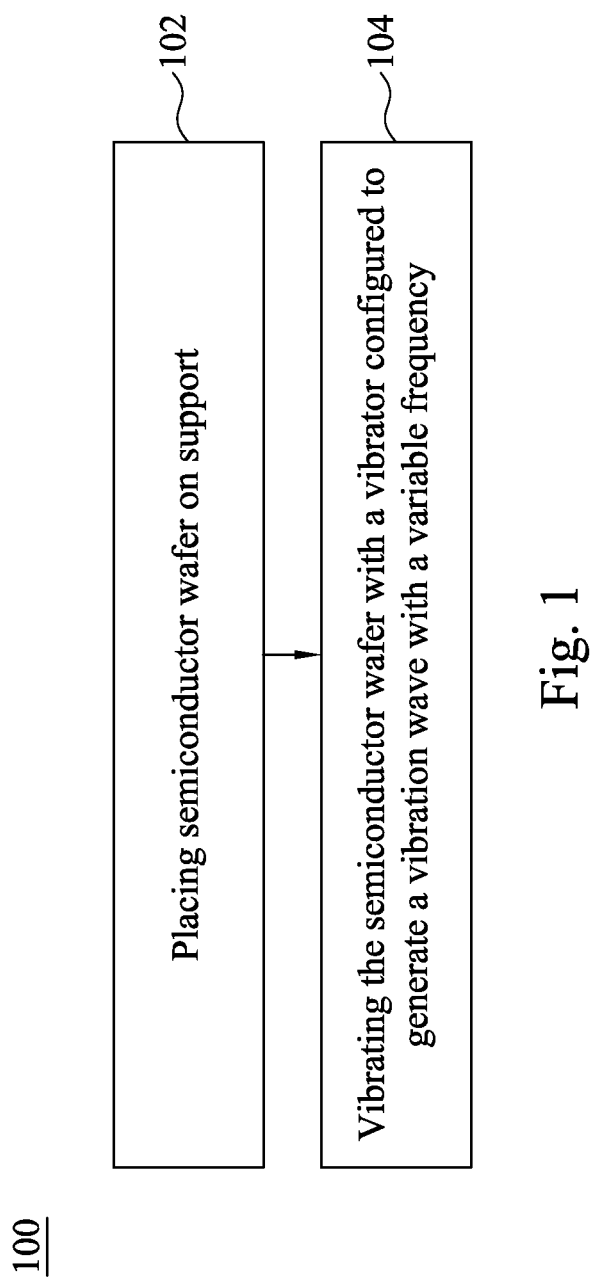
FIG. 1 is a flow chart illustrating a method of vibrating a semiconductor wafer, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 6:
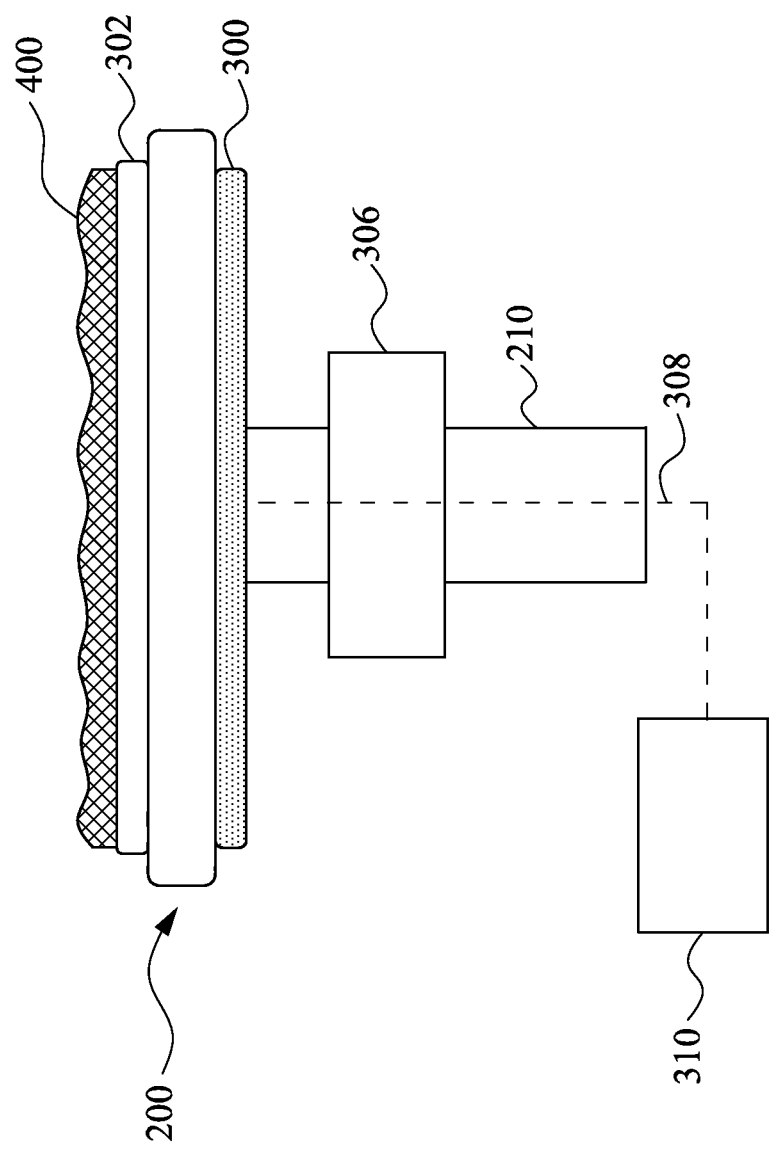
FIG. 6 is a perspective view of another embodiment of the apparatus for supporting a semiconductor wafer depicted in FIG. 5, in accordance with some embodiments.
Figure 7:
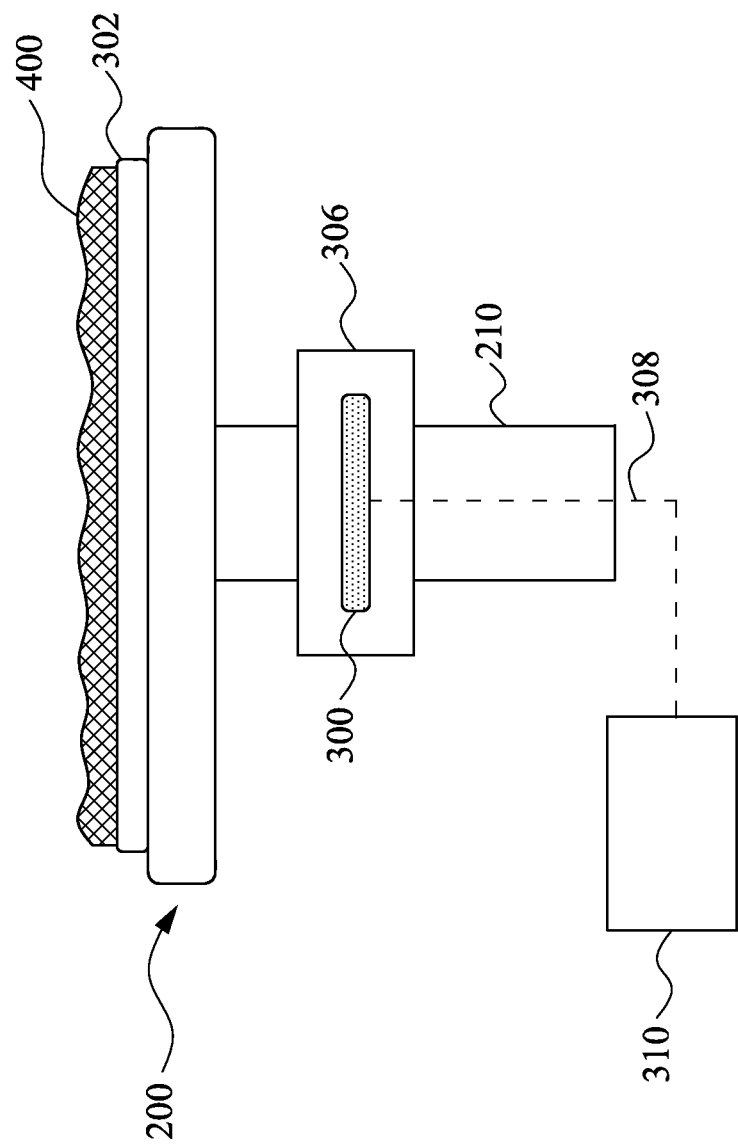
FIG. 7 is a perspective view of another embodiment of the apparatus for supporting a semiconductor wafer depicted in FIG. 5, in accordance with some embodiments.
Figure 8:
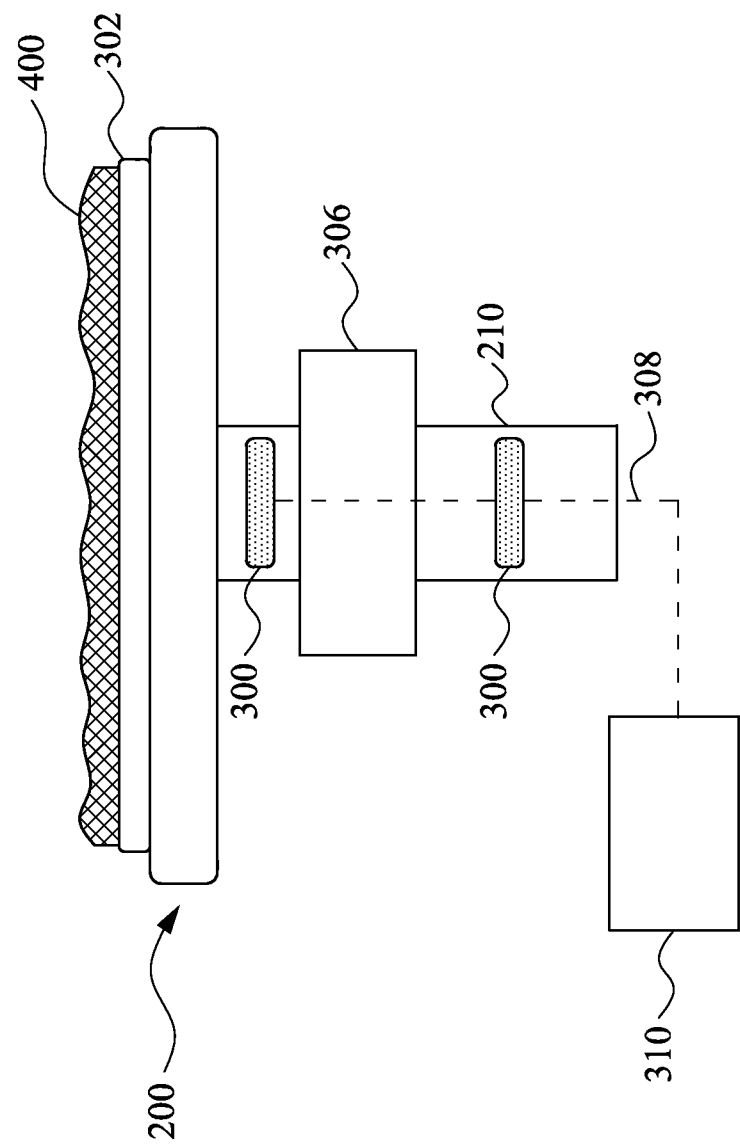
FIG. 8 is a perspective view of another embodiment of the apparatus for supporting a semiconductor wafer depicted in FIG. 5, in accordance with some embodiments.

FIG. 1 is a flow chart illustrating a method of vibrating a semiconductor wafer, in accordance with some embodiments. FIGS. 2-5 illustrates an apparatus for supporting a semiconductor wafer that may utilize the method depicted in FIG. 1, in accordance with some embodiments. FIGS. 6-8 illustrates other embodiments of the apparatus for supporting a semiconductor wafer that may utilize the method depicted in FIG. 1, in accordance with some embodiments. With reference to FIGS. 1 through 8 and other figures, the method 100 and the apparatus for supporting a semiconductor wafer in FIGS. 2-8 are collectively described.

Figure 2:
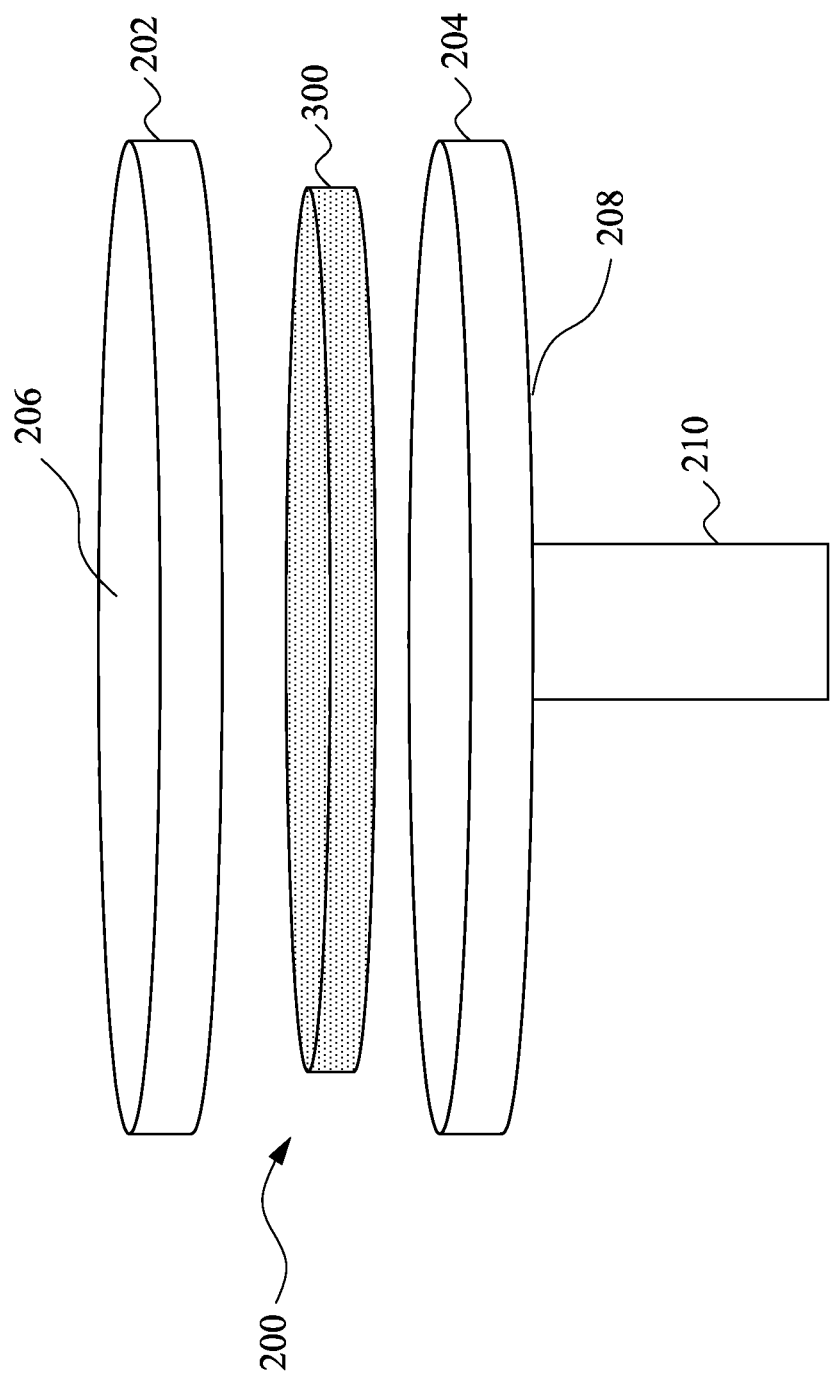
FIG. 2 is a perspective view of an apparatus for supporting a semiconductor wafer that may utilize the method depicted in FIG. 1, in accordance with some embodiments.

FIG. 2 is a perspective view of an apparatus for supporting a semiconductor wafer that may utilize the method depicted in FIG. 1, in accordance with some embodiments. In some embodiments of the present invention, the apparatus for supporting a semiconductor wafer includes a wafer supporter 200, wherein the wafer supporter has a first layer 202 with a first surface 206 for receiving a semiconductor wafer, a second layer 204 with a second surface 208 opposite to the first surface 206, and a vibrator 300 disposed between the first layer 202 and the second layer 204; and a spindle 210 attached to the second surface 208 of the wafer supporter 200.

In some embodiments, the vibrator 300 is embedded in between the first layer 202 and the second layer 204 thereby integrated with the wafer supporter 200. In some embodiments of the present invention, the vibrator 300 is coupled to the wafer supporter 200. In another embodiment, the vibrator 300 is configured to generate a vibration wave with a variable frequency. In embodiments of the present disclosure, the vibrator 300 is coupled to the wafer supporter 200 in such a way that it will not substantially affect the wafer supporter 200 in supporting a wafer.

In an embodiment of the present invention, the vibrator 300 is a piezoelectric vibrator, wherein the piezoelectric vibrator includes a piezoelectric material selected from the group consisting of lead zirconium titanate, barium titanate, lead zirconate titanate, potassium niobate, lithium niobate, lithium tantalite, sodium tungstate, sodium potassium niobate, bismuth ferrite, sodium niobate, bismuth titanate, sodium bismuth titanate or polyvinylidene fluoride. One should note that some of the structures of the piezoelectric vibrator have been omitted for the purpose of simplicity and clarity.

In other embodiments of the present invention, the vibrator 300 is a magnetic vibrator or actuator configured to generate a vibration wave with a variable frequency, ultrasound or sonic waves with a variable frequency, or any other suitable vibrator that can be configured to generate a vibration wave with a variable frequency. In some embodiments, the vibration wave with a variable frequency generated by the vibrator 300 is in periodic or non-periodic form. In some embodiments, the vibrator 300 is in direct contact or indirect contact with the semiconductor wafer 302. In other embodiments of the present invention, the vibrator 300 is in direct contact or indirect contact with the apparatus for supporting a semiconductor. In some embodiments of the present invention, when the apparatus for supporting a semiconductor uses acoustic waves as the source of vibration waves, the vibrator 300 is in indirect contact with the apparatus for supporting a semiconductor.

Figure 3:
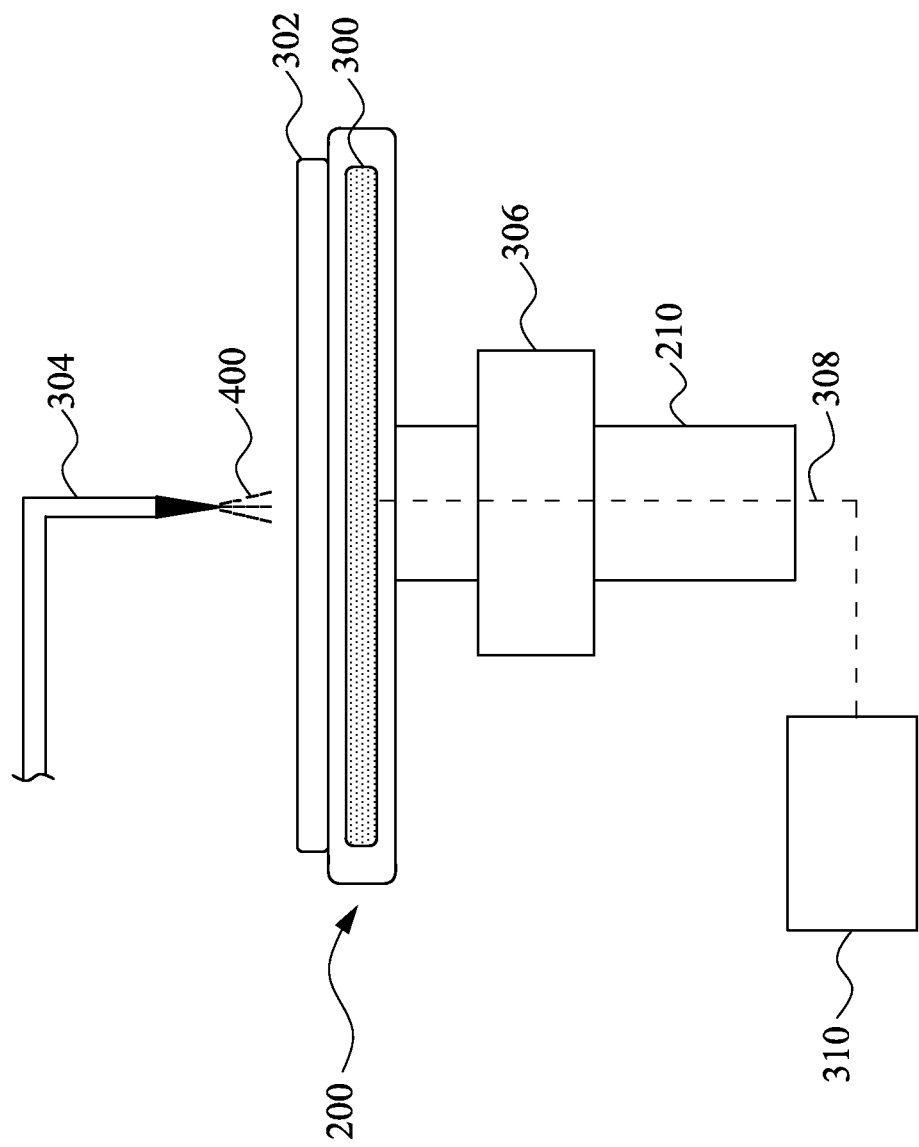
FIG. 3 is a perspective view of the apparatus for supporting a semiconductor wafer in FIG. 2 with a semiconductor wafer placed thereon and a processing liquid dispensing on the semiconductor wafer, in accordance with some embodiments.

Referring to FIGS. 1 and 3, the method 100 begins at operation 102, placing a semiconductor wafer on the support. FIG. 3 is a perspective view of the apparatus for supporting a semiconductor wafer in FIG. 2 with a semiconductor wafer 302 placed on the wafer supporter 200 with the vibrator 300 coupled therein, a processing liquid 400 is dispensed on the semiconductor wafer 302 by a dispenser 304, a spin motor 306 is coupled to a spindle 210, and a function generator 310 is electrically connected to the vibrator 300 by a cable 308.

In some embodiments, the semiconductor wafer 302 may be a 200 mm, 300 mm or 450 mm silicon wafer, or other substrate used to fabricate microelectronic devices and the like. In one or more embodiments, the semiconductor wafer 302 may be a material such as crystalline silicon (e.g., Si<100>, Si<111> or Si<001>), silicon oxide, strained silicon, silicon$_{(1-x)}$germanium$_x$, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. Furthermore, the semiconductor wafer 302 can also include dielectric materials such as silicon dioxide, organosilicates, and carbon doped silicon oxides.

The semiconductor wafer 302 may also include one or more conductive metals, such as nickel, titanium, platinum, molybdenum, rhenium, osmium, chromium, iron, aluminum, copper, tungsten, or combinations thereof. Furthermore, the semiconductor wafer 302 can include any other materials such as metal nitrides, metal oxides and metal alloys, depending on the application. In some embodiments, the semiconductor wafer 302 can form a contact structure, a metal silicide layer, or a gate structure including a gate dielectric layer and a gate electrode layer to facilitate connecting with an interconnect feature, such as a plug, via, contact, line, and wire, subsequently formed thereon, or suitable structures utilized in semiconductor devices.

In other embodiments, the semiconductor wafer 302 may include a plurality of isolation structures such as shallow trench isolation (STI) structures to isolate the active regions. In another embodiment, the semiconductor wafer 302 may be a bulk silicon substrate or a silicon-on-insulator substrate with expitaxial silicon disposed thereon.

In embodiments of the present invention, the processing liquid 400 can be any appropriate processing liquid in the respective processing step in manufacturing a semiconductor device. In an embodiment of the present invention, in a lithography process, the processing liquid 400 is a developer solution and the semiconductor wafer 302 includes a photoresist layer disposed thereon. In another embodiment of the present invention, in a cleaning process, the processing liquid 400 is water and the semiconductor wafer 302 includes residues. In another embodiment, in an etching process, the processing liquid 400 is an etchant and the semiconductor wafer 302 includes regions in which desired features are to be formed. In some embodiments, the processing liquid 400 may have microbubbles entrapped therein.

In some embodiments of the present invention, the function generator 310 is configured to generate a function with a variable frequency. In other embodiments, the function with a variable frequency generated by the function generator 310 causes the vibrator 300 to generate a vibration wave with a variable frequency. In some embodiments, the function with a variable frequency is in periodic or non-periodic form.

In other embodiments of the present invention, the function generator 310 may be a computer configured to generate a function with a variable frequency. In other embodiments, the function generator 310 may include one or more circuits configured to generate a function with a variable frequency.

Figure 4:
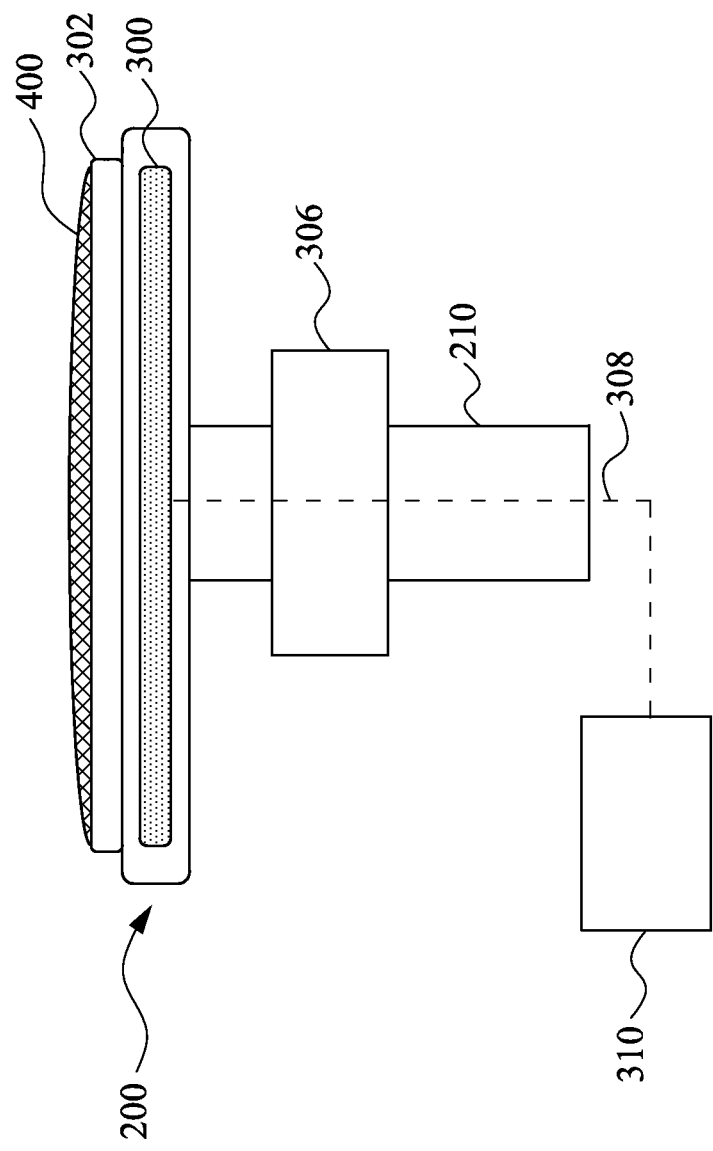
FIG. 4 is a perspective view of the apparatus for supporting a semiconductor wafer in FIG. 3 with the processing liquid forming a puddle on the semiconductor wafer, in accordance with some embodiments.

FIG. 4 is a perspective view of the apparatus for supporting a semiconductor wafer in FIG. 3 with the processing liquid 400 forming a puddle on the semiconductor wafer 302, in accordance with some embodiments. In some embodiments, the amount of processing liquid 400 dispensed is controlled so that a puddle is formed on the semiconductor wafer 302. In other embodiments, the processing liquid 400 is dispensed continuously and a puddle is not formed. One should note that the shape of the puddle of the processing liquid 400 in the figure is not drawn to scale or limited therein, the shape of the puddle in the figure is only for illustration.

Figure 5:
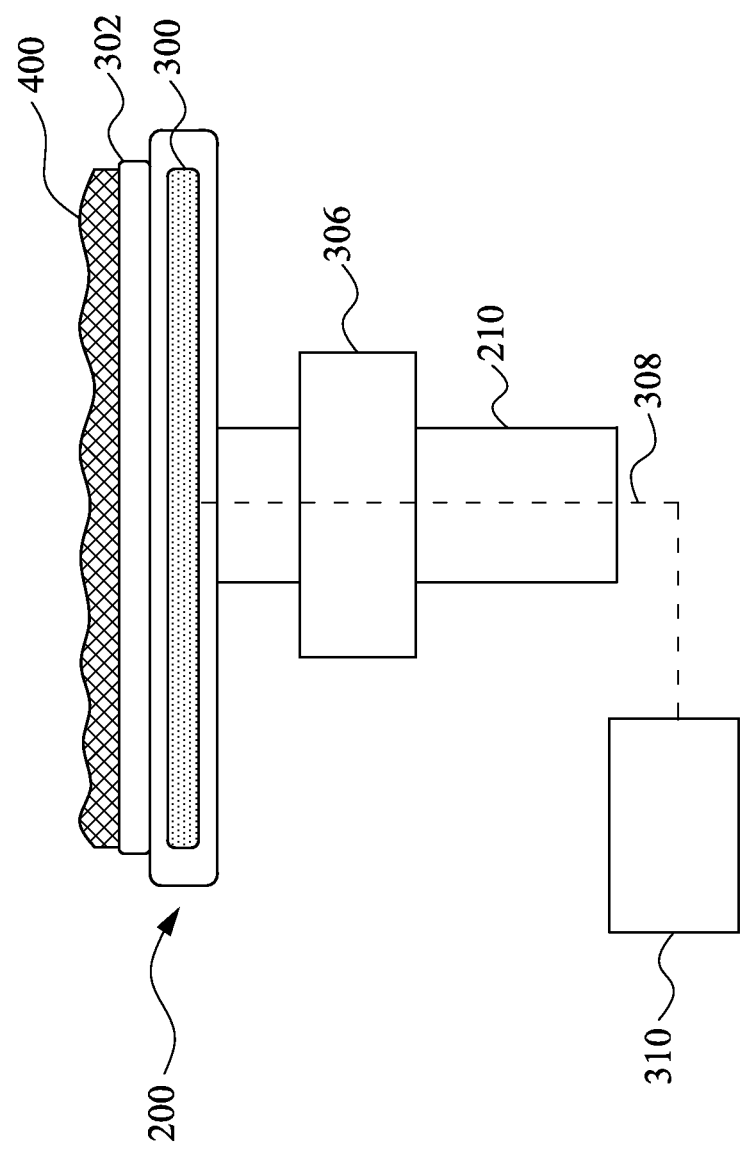
FIG. 5 is a perspective view of the apparatus for supporting a semiconductor wafer in FIG. 4 with the processing liquid being vibrated, in accordance with some embodiments.

Referring to FIGS. 1 and 5, the method 100 proceeds to operation 104, vibrating the semiconductor wafer 302 with the vibrator 300. FIG. 5 is a perspective view of the apparatus for supporting a semiconductor wafer in FIG. 4 with the processing liquid 400 being vibrated, in accordance with some embodiments. One should note that the shape of the waves of the processing liquid 400 in the figures are not drawn to scale or limited therein, the shape of the waves in the figures are only for illustration. In embodiments of the present invention, the function generator 310 may generate a sine, square, triangular, saw tooth, or other similar functions. In some embodiments of the present invention, the function generator 310 generates a function with a variable frequency that causes the vibrator 300 to generate a vibration wave with a variable frequency. In some embodiments, the vibration wave with a variable frequency is in periodic or non-periodic form. One should note that the vibration wave disclosed herein refer to vibrations, micro vibrations, acoustic waves, sonic waves, ultrasound waves or any other appropriate form of vibrations.

In embodiments of the present invention, the frequency and/or amplitude of the function generator 310 may be tuned to a desired value. In some embodiments, the vibration wave with a variable frequency generated with the function generator 310 may have different amplitudes. In embodiments, the vibration wave with a variable frequency generated with the function generator 310 may have variable amplitudes and/or variable wavelengths.

In some embodiments, since the vibration wave has a variable frequency, the apparatus for supporting a semiconductor wafer will not undergo the resonating effect. In another embodiment, since the vibration wave has a variable frequency, the semiconductor wafer 302 and the features on the semiconductor wafer 302 will not undergo the resonating effect and detach or break. In some embodiments of the present invention, since the vibration wave has a variable frequency, processing layers such as a photoresist layer on the semiconductor wafer 302 will not undergo the resonating effect and detach. In some other embodiments, the variable frequency ranges from 100 Hz to 2000 Hz. In other embodiments, the variable frequency ranges from 100 Hz to 1500 Hz. In another embodiment, the variable frequency is selected so that the semiconductor wafer 302 does not resonate and the features on the semiconductor wafer 302 is not damaged or detached. In some embodiments, the resonating frequency is dependent on various parameters such as the type of semiconductor material, the features thereon, the aspect ratio of the features, the thickness of the material, the type of processing layers, the thickness of the processing layers etc.

In embodiments of the present invention, the direction of the vibration generated by the vibrator 300 may be in the lateral direction. In another embodiment, the direction of the vibration generated by the vibrator 300 is in the horizontal direction. In one embodiment, the direction of the vibration generated by the vibrator 300 is in the vertical direction and horizontal direction thereby generating a clockwise and/or anti-clockwise rotating vibrations. In some embodiments of the present invention, when the vibrator 300 is positioned near the edge of the wafer supporter 200, a vertical vibration can cause a vibration in a form similar to flinging the wafer supporter 200, a horizontal vibration can cause a vibration in a form similar to rotating the wafer supporter 200.

In some embodiments, microbubbles may be entrapped in the processing liquid during dispensing or be entrapped between the surface of the semiconductor wafer and the processing liquid. In embodiments of the present invention, vibrating the processing fluid 400 can facilitate the microbubbles in bubbling out of the processing fluid 400. In other embodiments, the microbubbles in the processing fluid 400 may be bubbled out by using an acoustic vibration wave with a variable frequency.

In one embodiment of the present invention, in a lithography process, when dispensing a photoresist (processing fluid 400) onto a semiconductor wafer 302, the surface of the semiconductor wafer 302 may have microbubbles entrapped between the interface between the semiconductor wafer 302 and the processing fluid 400, these microbubbles may cause non-uniform features in the resulting semiconductor device. In some other embodiments, the vibration of the processing fluid 400 can facilitate the microbubbles in bubbling out of the processing fluid 400 thereby enhancing the uniformity and efficiency of the resulting semiconductor device features.

In an embodiment of the present invention, in a lithography process, when dispensing a developer (processing fluid 400) onto a semiconductor wafer 302 with a photoresist thereon, the surface of the semiconductor wafer 302 may have microbubbles entrapped between the interface between the semiconductor wafer 302 and the processing fluid 400, these microbubbles may cause defect in the features in the resulting semiconductor device. In some other embodiments, the vibration of the processing fluid 400 can facilitate the microbubbles in bubbling out of the processing fluid 400 thereby reducing the developing time. In another embodiment of the present invention, the vibration of the processing fluid 400 can facilitate the microbubbles in bubbling out of the processing fluid 400 thereby enhancing the uniformity and efficiency of the resulting semiconductor device features.

In some embodiments of the present disclosure, the processing liquid 400 may be limited by solution diffusibility and becomes stagnant, the vibrations can agitate and facilitate the circulation of the processing fluid 400, thereby enhancing the uniformity and efficiency of the resulting semiconductor device features. In some embodiments, the vibration of the processing fluid 400 can facilitate the processing fluid 400 in circulating in and out of narrow channels or features. In some other embodiments, the vibration of the processing fluid 400 can facilitate the processing fluid 400 in circulating in and out of narrow channels or features thereby reducing the processing time. In other embodiments, an acoustic vibration wave with a variable frequency may be used to circulate the processing fluid 400.

In some embodiments, in a lithography process, the developing speed may be limited by solution diffusibility and the developer (processing liquid 400) becomes stagnant with the photoresist and fresh developer cannot diffuse toward the photoresist, the vibrations can agitate and facilitate the circulation of the processing fluid 400, thereby enhancing the uniformity and efficiency of the resulting semiconductor device features. In some other embodiments, the vibration of the processing fluid 400 can facilitate the processing fluid 400 in circulating in and out of narrow channels or features thereby reducing the developing time. In another embodiment, the vibration can facilitate the processing fluid 400 in circulating in and out of narrow channels or features thereby reducing the amount of developer used. In some embodiments, since the vibration can facilitate the developer in developing, the exposure energy can be reduced.

In some other embodiments, in a cleaning process, the residues may cling or become trapped in narrow channels or narrow features, the vibrations can agitate and facilitate the circulation of the cleaning fluid (processing fluid 400), thereby enhancing the cleanness of the resulting semiconductor device features. In some other embodiments, the vibration of the processing fluid 400 can facilitate the processing fluid 400 in circulating in and out of narrow channels or features thereby reducing the cleaning time. In another embodiment, the vibration can detach the residues attached to the semiconductor wafer 302 and allow the processing fluid 400 to remove the residues.

In other embodiments, in an etching process, the etching speed may be limited by solution diffusibility and the etchant (processing liquid 400) becomes stagnant and fresh etchant cannot diffuse toward the surface, the vibrations can agitate and facilitate the circulation of the processing fluid 400, thereby enhancing the uniformity and efficiency of the resulting semiconductor device features. In some other embodiments, the vibration of the processing fluid 400 can facilitate the processing fluid 400 in circulating in and out of narrow channels or features thereby reducing the etching time.

In one embodiment of the present invention, in an etching process, the vibration can facilitate the detachment of a mask layer (such as a photoresist layer or a hard mask layer)

attached to the semiconductor wafer 302. In some other embodiments, the vibration can facilitate the processing fluid 400 in circulation and detachment of the mask layer thereby reducing the etching time. In another embodiment, the vibration can facilitate the detachment of the mask layer thereby reducing the amount of etchant used.

In some embodiments of the present invention, in a MEMS (Microelectromechanical systems) process, the vibrations can facilitate the etchant in etching the sacrificial layer in narrow channels or narrow features, thereby enhancing the uniformity and efficiency of the resulting semiconductor device features. In some other embodiments, after removing the sacrificial layer, the movable part of the MEMS may cling to the substrate or other features, the vibration of the vibrator 300 can facilitate the movable parts in lifting off and/or separate the movable parts from clinging to each other.

In embodiments of the present invention, the wafer supporter 200 can be mechanically rotated by the spin motor 306. In some embodiments, the mechanical rotation by the spin motor 306 can agitate and facilitate the circulation of the processing fluid 400. In some embodiments, the spin motor 306 and the vibrator 300 can be used simultaneously to agitate and facilitate the circulation of the processing fluid 400. In another embodiment, the spin motor 306 and the vibrator 300 are used alternatingly to agitate and facilitate the circulation of the processing fluid 400. In some embodiments, the spin motor 306 rotates clockwise and anticlockwise alternatingly to agitate and facilitate the circulation of the processing fluid 400.

FIG. 6 is a perspective view of another embodiment of the apparatus for supporting a semiconductor wafer depicted in FIG. 5, in accordance with some embodiments. In some embodiments, the vibrator 300 is in direct contact or indirect contact with the semiconductor wafer 302. In other embodiments of the present invention, the vibrator 300 is in direct contact or indirect contact with the apparatus for supporting a semiconductor. In some embodiments of the present invention, the apparatus for supporting a semiconductor wafer includes a wafer supporter 200, a vibrator 300 disposed below the wafer supporter 200, and a spindle 210 attached to the wafer supporter 200. In other embodiments, the vibrator 300 is disposed on the wafer supporter 200 so that the vibrator is in direct contact with the semiconductor wafer 302. In other embodiments of the present invention, the vibrator 300 is in direct contact with the apparatus for supporting a semiconductor and therefore in indirect contact with the semiconductor wafer 302.

FIG. 7 is a perspective view of another embodiment of the apparatus for supporting a semiconductor wafer depicted in FIG. 5, in accordance with some embodiments. In some embodiments, the vibrator 300 is in direct contact or indirect contact with the semiconductor wafer 302. In some embodiments of the present invention, the apparatus for supporting a semiconductor wafer includes a wafer supporter 200, a vibrator 300 disposed on a spin motor 306, and a spindle 210 attached to the wafer supporter 200. In other embodiments, the vibrator 300 is disposed in the spin motor 306. In another embodiment, the vibrator 300 is embedded in the spin motor 306.

FIG. 8 is a perspective view of another embodiment of the apparatus for supporting a semiconductor wafer depicted in FIG. 5, in accordance with some embodiments. In some embodiments, the vibrator 300 is in direct contact or indirect contact with the semiconductor wafer 302. In some embodiments of the present invention, the apparatus for supporting a semiconductor wafer includes a wafer supporter 200, a spin motor 306, a spindle 210 attached to the wafer supporter 200, and a vibrator 300 disposed on the spindle 210. In other embodiments, the vibrator 300 is disposed in the spindle 210. In another embodiment, the vibrator 300 is embedded in the spindle 210.

In some embodiments of the present invention, one or more vibrators 300 may be used in the apparatus for supporting a semiconductor wafer. In one embodiment, two vibrators 300 are disposed in the spindle 210. In another embodiment, a vibrator 300 is disposed on the spindle 210 and another vibrator 300 is embedded in the wafer supporter 200. In another embodiment, a vibrator 300 may be disposed on the spindle 210, another vibrator 300 may be embedded in the wafer supporter 200, and another vibrator 300 disposed on the spin motor 306. In some embodiments of the present invention, a plurality of vibrators 300 may be used in the apparatus for supporting a semiconductor wafer to altogether generate a vibration wave. In another embodiment, a plurality of vibrators 300 may be used in the apparatus for supporting a semiconductor wafer to altogether generate a vibration wave with a variable frequency.

In some embodiments, when one or more vibrators 300 are used to altogether generate a vibration wave with a variable frequency, the vibrators 300 may each independently generate a different vibration wave with a variable frequency. In other embodiments, the vibrators 300 may each independently generate the same vibration wave with a variable frequency. In another embodiment, when one or more vibrators 300 are used to altogether generate a vibration wave with a variable frequency, the vibrators 300 may each independently generate a vibration wave, wherein at least one of the vibrators may generate a vibration wave with a variable frequency.

In other embodiments, when one or more vibrators 300 are used to altogether generate a vibration wave with a variable frequency, the vibrators 300 may be the same or different types of vibrators, for example, the apparatus for supporting a semiconductor wafer may include a piezoelectric vibrator embedded in the wafer supporter 200 and a magnetic vibrator coupled to the spindle 210, or a piezoelectric vibrator embedded in the wafer supporter 200 is used along with an external acoustic wave. One should note that the type of vibrators 300 disclosed herein are for illustration only and are not limited thereto, other types of vibrators that can generate a vibration with a variable frequency may be used.

In embodiments of the present invention, the location of the vibrator 300 is selected to be at a position in close proximity to the semiconductor wafer 302 so that the semiconductor wafer 302 can receive vibrations from the vibrator 300. In some embodiments, the vibrator 300 may be in direct or indirect contact with the semiconductor wafer 302. In some other embodiments, the vibrator 300 may be in direct or indirect contact with the apparatus for supporting a semiconductor wafer. One should note that the position and location of the vibrator 300 disclosed herein are for illustration only and are not limited thereto, other positions and locations are possible as along as the semiconductor wafer 302 can receive the vibration waves from the vibrator 300.

In some embodiments of the present disclosure, the vibrations can agitate and facilitate the circulation of the processing fluids, thereby enhancing the uniformity and efficiency of the resulting semiconductor device features. In some embodiments, the vibration of the processing fluids can facilitate the processing fluids in circulating in and out of narrow channels or features. In embodiments, the vibration of the processing fluids can facilitate bubbling out the microbubbles entrapped in the processing liquid or entrapped between the surface of the semiconductor wafer and the processing liquid. In some embodiments, the vibrations generated by the vibrator have vibration waves with a variable frequency to avoid resonance. In some embodiments, the vibrator is a piezoelectric vibrator.

In some embodiments, an apparatus for supporting a semiconductor wafer is provided, the apparatus includes a wafer supporter, and a vibrator coupled to the wafer supporter, the vibrator is configured to generate a vibration wave with a variable frequency on the semiconductor wafer.

In some embodiments of the present invention, a method of vibrating a semiconductor wafer is provided, the method includes placing the semiconductor wafer on a wafer supporter, and vibrating the semiconductor wafer with a vibrator, wherein the vibrator is configured to generate a vibration wave with a variable frequency.

In other embodiments, an apparatus for supporting a semiconductor wafer is provided, the apparatus includes a wafer supporter, wherein the wafer supporter includes a first surface for receiving the semiconductor wafer and a second surface opposite to the first surface, and the apparatus also includes a piezoelectric vibrator coupled to the wafer supporter.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising:
a developing unit configured to develop photoresist on a semiconductor wafer, the developing unit including:
 a wafer supporter configured to support the semiconductor wafer thereon;
 a spindle connected to the wafer supporter, wherein the spindle comprises a first portion and a second portion;
 a spin motor disposed vertically between the first portion and the second portion of the spindle;
 a piezoelectric vibrator configured to generate a first vibration wave on the semiconductor wafer and including a piezoelectric material configured, wherein the piezoelectric vibrator is vertically between the wafer supporter and the spin motor;
 at least one circuit electrically and directly connected to the piezoelectric vibrator;
 a dispenser configured to dispense a developer on the semiconductor wafer; and
 a second vibrator disposed in the second portion of the spindle, the spin motor being vertically between the piezoelectric vibrator and the second vibrator, and the second vibrator being configured to generate a second vibration wave different from the first vibration wave, wherein the second vibration wave is transmitted in a horizontal direction that is parallel to a top surface of the wafer supporter.

2. The apparatus of claim 1, wherein the spin motor is configured to rotate the wafer supporter.

3. The apparatus of claim 1, wherein said first vibration wave of the piezoelectric vibrator is in periodic or non-periodic form and a frequency of the first vibration wave of the piezoelectric vibrator is selected so as not to detach the photoresist from the semiconductor wafer.

4. The apparatus of claim 1, wherein said piezoelectric material is selected from the group consisting of: lead zirconium titanate, barium titanate, lead zirconate titanate, potassium niobate, lithium niobate, lithium tantalite, sodium tungstate, sodium potassium niobate, bismuth ferrite, sodium niobate, bismuth titanate, sodium bismuth titanate, and polyvinylidene fluoride.

5. The apparatus of claim 1, further comprising:
a cable through the spindle and electrically connected to the piezoelectric vibrator.

6. A method comprising:
placing a semiconductor wafer on a wafer supporter, wherein the wafer supporter is connected to a spindle having a first portion and a second portion; and
developing a photoresist on the semiconductor wafer by:
 dispensing a processing liquid to the semiconductor wafer;
 rotating the semiconductor wafer using a spin motor vertically between the first portion and the second portion of the spindle; and
 vibrating the semiconductor wafer using a first vibrator in the first portion of the spindle to generate a first vibration wave and a second vibrator in the second portion of the spindle to generate a second vibration wave different from the first vibration wave,
 wherein the first vibrator is vertically between the semiconductor wafer and the spin motor, and the spin motor is vertically between the first vibrator and the second vibrator;
 wherein the first vibration wave is generated adjacent an edge of the wafer supporter and transmitted in a horizontal direction.

7. The method of claim 6, wherein said first vibration wave is in periodic or non-periodic form.

8. The method of claim 6, wherein the dispensing is such that a puddle of the processing liquid is formed on the semiconductor wafer.

9. The method of claim 6, wherein the vibrating is such that microbubbles are bubbled out of the processing liquid.

10. The method of claim 6, further comprising alternately rotating the semiconductor wafer and vibrating the semiconductor wafer.

11. The method of claim 6, wherein vibrating the semiconductor wafer includes directly vibrating the spin motor using the first vibrator.

12. The method of claim 6, further comprising preventing the semiconductor wafer from undergoing a resonating effect by causing the first vibration wave to have a frequency that varies during developing the photoresist.

13. The method of claim 6, wherein rotating the semiconductor wafer is repeated multiple times, and the vibrating of the semiconductor wafer is performed between two consecutively conducted operations of rotating the semiconductor wafer.

14. The method of claim 6, wherein rotating the semiconductor wafer is repeated multiple times, a first rotation of the semiconductor wafer is rotated clockwise and a second rotation of the semiconductor wafer is rotated counterclockwise;

wherein the vibrating of the semiconductor wafer is performed between the first rotation of the semiconductor wafer and the second rotation of the semiconductor wafer.

15. An apparatus comprising:
a developing unit configured to develop photoresist on a semiconductor wafer, the developing unit including:
a dispenser configured to dispense a developer on the semiconductor wafer;
a spindle;
a spin motor connected to the spindle;
a wafer supporter comprising a top surface and a bottom surface;
a first vibrator disposed below the top surface of the wafer supporter and configured to generate a first vibration wave; and
a second vibrator having a piezoelectric material embedded in the spin motor, wherein the second vibrator is configured to generate a second vibration wave different from the first vibration wave, and the second vibration wave is transmitted in a horizontal direction that is parallel to the top surface of the wafer supporter.

16. The apparatus of claim 15, wherein the spindle is attached to the bottom surface of the wafer supporter.

17. The apparatus of claim 15, wherein said first vibrator is positioned on the bottom surface of said wafer supporter.

18. The apparatus of claim 15, wherein said first vibrator comprises a material selected from the group consisting of: lead zirconium titanate, barium titanate, lead zirconate titanate, potassium niobate, lithium niobate, lithium tantalite, sodium tungstate, sodium potassium niobate, bismuth ferrite, sodium niobate, bismuth titanate, sodium bismuth titanate, and polyvinylidene fluoride.

19. The apparatus of claim 15, wherein the first vibrator is on the bottom surface of the wafer supporter or the spindle.

20. The apparatus of claim 15, further comprising a function generator coupled to the first vibrator and configured to generate a function that causes the first vibration wave to have a variable frequency.

* * * * *